US007743492B2

(12) United States Patent
Kerr et al.

(10) Patent No.: US 7,743,492 B2
(45) Date of Patent: Jun. 29, 2010

(54) METHOD FOR FORMING CAST FLEXIBLE SUBSTRATE AND RESULTANT SUBSTRATE AND ELECTRONIC DEVICE

(75) Inventors: Roger Stanley Kerr, Brockport, NY (US); Timothy John Tredwell, Fairport, NY (US); Yongtaek Hong, Seoul (KR)

(73) Assignee: Carestream Health, Inc., Rochester, NY (US)

( * ) Notice: Subject to any disclaimer, the term of this patent is extended or adjusted under 35 U.S.C. 154(b) by 83 days.

(21) Appl. No.: 12/028,206

(22) Filed: Feb. 8, 2008

(65) Prior Publication Data
US 2009/0199401 A1 Aug. 13, 2009

(51) Int. Cl.
*H05K 3/30* (2006.01)
(52) U.S. Cl. .............................. 29/832; 29/829; 29/830; 174/254; 174/259; 174/260; 164/46; 164/47; 164/2; 264/299; 264/309; 264/316; 264/336; 438/458; 438/459
(58) Field of Classification Search ................ 29/829, 29/830, 832; 257/E23.065, E23.177; 438/149–166; 174/254–256, 258, 260; 164/2, 46, 47; 264/209, 264/309, 316, 336, 337
See application file for complete search history.

(56) References Cited
U.S. PATENT DOCUMENTS

| | | | | |
|---|---|---|---|---|
| 5,108,819 A | * | 4/1992 | Heller et al. ............. | 428/195.1 |
| 5,391,257 A | * | 2/1995 | Sullivan et al. ............ | 438/458 |
| 6,492,026 B1 | | 12/2002 | Graff et al. | |
| 6,596,569 B1 | * | 7/2003 | Bao et al. .................... | 438/151 |
| 7,045,442 B2 | | 5/2006 | Maruyama et al. | |
| 2007/0091062 A1 | | 4/2007 | French et al. | |

FOREIGN PATENT DOCUMENTS

JP          07-325297          12/1995

OTHER PUBLICATIONS

U.S. Appl. No. 11/461,080, filed Jul. 31, 2006, titled: Flexible Substrate With Electronic Devices Formed Thereon, by Timothy John Tredwell et al.
U.S. Appl. No. 12/028,194, filed Feb. 8, 2008 titled: Method for Forming an Electronic Device on a Flexible Substrate Supported on a Detachable Carrier, by Roger Scott Kerr et al.
U.S. Appl. No. 11/538,173, titled: Flexible Substrate With Electronic Devices and Traces, filed Oct. 3, 2003, by Roger Scott Kerr et al.
U.S. Appl. No. 12/028,174, filed Feb. 8, 2008 titled:Method for Forming an Electronic Device an Electronic Device on a Flexible Stainless Steel Substrate and Resultant Device, by Roger Scott Kerr et al.
U.S. Appl. No. 12/028,182, filed Feb. 8, 2008 titled: Method for Forming an Electronic Device on a Substrate Supported by a Carrier and Resultant Device, by Roger Scott Kerr et al.

* cited by examiner

*Primary Examiner*—Derris H Banks
*Assistant Examiner*—Jeffrey Carley (57) ABSTRACT

A method for forming an electronic device provides a casting master having a casting surface, and deposits a substrate material onto the casting surface to form a flexible substrate sheet of predetermined thickness, wherein the flexible substrate sheet has a circuit-side surface that is formed against the casting surface. The flexible substrate sheet is released from the master and secured against a carrier, with the circuit-side surface facing outward. An electronic device is then formed on the circuit-side surface.

19 Claims, 9 Drawing Sheets

METHOD FOR FORMING CAST FLEXIBLE SUBSTRATE AND RESULTANT SUBSTRATE AND ELECTRONIC DEVICE

CROSS REFERENCE TO RELATED APPLICATIONS

Reference is made to U.S. Ser. No. 11/461,080 by Kerr et al. entitled FLEXIBLE SUBSTRATE WITH ELECTRONIC DEVICES FORMED THEREON, filed Jul. 31, 2006; U.S. Ser. No. 11/538,173 by Kerr et al. entitled FLEXIBLE SUBSTRATE WITH ELECTRONIC DEVICES AND TRACES, filed Oct. 3, 2006; U.S. Ser. No. 12/028,194 by Kerr et al. entitled METHOD FOR FORMING AN ELECTRONIC DEVICE ON A FLEXIBLE SUBSTRATE SUPPORTED BY A DETACHABLE CARRIER, filed Feb. 8, 2008; U.S. Ser. No. 12/028,182 by Kerr et al entitled METHOD FOR FORMING AN ELECTRONIC DEVICE ON A SUBSTRATE SUPPORTED BY A CARRIER AND RESULTANT DEVICE, filed Feb. 8, 2008; and U.S. Ser. No. 12/028, 174 by Kerr et al entitled METHOD FOR FORMING AN ELECTRONIC DEVICE ON A FLEXIBLE METALLIC SUBSTRATE AND RESULTANT DEVICE, filed Feb. 8, 2008.

FIELD OF THE INVENTION

This invention generally relates to electronic device fabrication and more particularly relates to a flexible substrate for electronic device fabrication, wherein the substrate is formed by casting on a master.

BACKGROUND OF THE INVENTION

There is increasing interest in the development of flexible circuitry for use in a range of devices, including electro-optical arrays and display panels. Proposed solutions for fabricating thin-film transistor (TFT) devices, used in switching and driver circuitry, onto flexible metallic and plastic substrates have not yet met with commercial success, however.

Conventionally, TFT devices have been fabricated on rigid substrates, typically glass or silicon, using a well-known sequence of deposition, patterning and etching steps. For example, amorphous silicon TFT devices require deposition, patterning, and etching of metals, such as aluminum, chromium or molybdenum; of amorphous silicon semiconductors; and of insulators, such as SiO2 or Si3N4, onto a substrate. The semiconductor thin film is formed in layers having typical thicknesses ranging from several nm to several hundred nm, with intermediary layers having thicknesses on the order of a few microns, and may be formed over an insulating surface that lies atop the rigid substrate.

The requirement for a rigid substrate has been based largely on the demands of the fabrication process itself. Rigidity allows the fabrication system to more accurately register the substrate in position for the different process steps. Thermal characteristics are also particularly important. TFT devices are fabricated at relatively high temperatures, making it difficult to work with many types of plastics and with some metals, due to thermal expansion characteristics. Thus far, the range of substrate materials that have been used successfully is somewhat limited, generally to glass, quartz, or other rigid, silicon-based materials.

In prototype work of various workers skilled in the circuit fabrication arts, TFT devices have been formed on some types of metal foil and plastic substrates, indicating that there is at least some measure of flexibility that can be allowed for their fabrication. However, inherent problems include chemical incompatibility between the substrate and TFT materials, thermal expansion mismatch between substrate and device layers, and difficulties with planarity and surface morphology. These problems must be satisfactorily resolved in order to make commercialization a reality. Various problems associated with the difficulty of forming electronic devices on a plastic substrate are discussed in a paper presented by Kim et al on Aug. 19, 2007 at the International Conference on Amorphous and Noncrystalline Semiconductors (ICANS), entitled Performance of a-Si—H n-i-p Photodiodes on Plastic Substrate.

The fabrication process for the TFT can require temperatures typically in the range of 125-300 degrees C. or higher, including temperatures at levels where many types of plastic substrates would be unusable. Thus, it is widely held, as is stated in U.S. Pat. No. 7,045,442 (Maruyama et al.), that a TFT cannot be directly formed on a plastic substrate.

As one alternative solution, U.S. Pat. No. 6,492,026 (Graff et al.) discloses the use of flexible plastic substrates having relatively high glass transition temperatures Tg, typically above 120 degrees C. However, the capability for these substrates to withstand conventional TFT fabrication temperatures much above this range is questionable. Moreover, in order to use these plastics, considerable effort is expended in protecting the substrate and the device(s) formed from scratch damage and moisture permeation, such as using multiple barrier layers. The use of high-performance plastics, as is noted in the Graff et al. '026 disclosure, still leaves thermal expansion difficulties (expressed using Coefficient of Thermal Expansion, CTE). Solutions of this type generally require additional planarization and isolation layers and processes in order to protect the plastic.

One strategy that shows some promise relates to the use of a rigid carrier during fabrication. As one example, in order to provide the benefits of TFT devices mounted on a plastic substrate, the same Maruyama et al. '442 disclosure describes a method that forms the TFT on a release layer that is initially attached to a carrier. Once the TFT circuitry is fabricated, the release layer is then separated from its carrier and can be laminated onto a lighter and more flexible plastic material.

Although this and similar solutions have been proposed for forming TFT components on flexible substrates, drawbacks remain. Lamination of a release layer that is populated with TFT devices, as described in Maruyama et al. '442 requires additional fabrication steps and materials and presents inherent alignment difficulties.

TFT fabrication onto flexible substrates, then, generally requires that the substrate be held on a carrier of some type during the various stages of layer deposition. One of the more important functions of such a carrier is providing dimensional stability to the flexible substrate. Thus, for example, a rigid glass carrier is conventionally provided. As described in Japanese Patent Publication Number JP 7-325297 A2 (Ichikawa), TFT devices can be formed onto a plastic substrate temporarily held to a glass carrier by means of an adhesive layer.

The use of a conventional glass carrier, however, imposes some constraints on the types of flexible substrate materials that can be used. Some types of plastics are compatible with the use of a glass substrate, but can be impractical because they exhibit transition Tg temperatures near the region of temperatures used for deposition. Thus, plastic substrates can tend to soften somewhat, allowing expansion during a fabrication cycle. Metals do not have this disadvantage. However, metallic materials are not as dimensionally "forgiving" with change in temperature. A significant difference in coefficient of thermal expansion (CTE) between metals and glass results in excessive stress that can shatter glass or can cause a metal substrate to release from a glass carrier prematurely, losing its dimensional stability.

Another problem relates to surface quality of the substrate, also termed planarity. TFT fabrication requires that the substrate surface be extremely smooth, with no more than about 50 nm peak-to-peak roughness. However, this level of smoothness is extremely difficult to achieve without special tooling or other processing of the plastic. Even methods such as spin coating or other deposition techniques are not able to achieve smoothness at this level repeatably and at low cost.

U.S. Patent Application Publication No. 2007/0091062 entitled "Active Matrix Displays and Other Electronic Devices Having Plastic Substrates" by French et al. describes forming a flexible substrate by first depositing substrate material onto a glass carrier plate, with an optional release layer between them. Then, once the substrate thickness is achieved, the exposed substrate surface can be treated for planarization, such as by adding one or more additional layers, and circuit components such as TFT arrays can be fabricated thereon. At the end of the component fabrication process, the substrate and its circuitry are then removable from the glass carrier, such as using a laser release process.

With methods such as those disclosed in the '1062 French et al. application, care must be taken to provide a highly smooth and uniform surface, using deposition methods such as spin coating, skiving with a blade, or various printing techniques. However, even with the use of spin coating and other highly precise deposition methods, the surface of the deposited substrate may still need further treatment steps to improve planarization before circuit lay-down can begin. This adds complexity and cost to the electronic device fabrication process.

Thus, it can be seen that although there has been great interest in developing and expanding the use of both plastics and metals as flexible substrates, the need for extra steps in surface treatment such as planarization remains.

SUMMARY OF THE INVENTION

The present invention addresses the need for flexible substrates for electronic device fabrication. With this object in mind, the present invention provides a method for forming an electronic device comprising forming a master having a casting surface; depositing a substrate material onto the casting surface to form a flexible substrate sheet of predetermined thickness, wherein the flexible substrate sheet has a circuit-side surface that is formed against the casting surface; releasing the flexible substrate sheet from the master; securing the flexible substrate sheet against a carrier, with the circuit-side surface facing outward; and forming the electronic device on the circuit-side surface.

A feature of the present invention is that it provides a cast flexible substrate, and an electronic device fabricated onto such a flexible substrate. The range of flexible substrates available using embodiments of the present invention can include various types of plastics and metals.

An advantage of the present invention is that it provides a substrate that has an exceptionally smooth circuit-side surface and that can be used with a carrier formed from glass or other material.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings.

DETAILED DESCRIPTION OF THE INVENTION

It is to be understood that elements not specifically shown or described in the following detailed description may take various forms well known to those skilled in the art.

Figures given in this application are representative of overall spatial relationships and arrangement of layers for deposition onto a substrate and may not be drawn to scale. As the term is used in the present description, "plastic" refers to a material having a high polymer content, usually made from polymeric synthetic resins, which may be combined with other ingredients, such as curing agents, fillers, reinforcing agents, colorants, and plasticizers. A "resin" is a synthetic or naturally occurring polymer. Plastic is solid in its finished state, and at some stage during its manufacture or processing into finished articles, can be shaped by flow. Plastics are typically formed using a curing process, in which a solvent may be evaporated at a suitable rate. Curing can also be performed using ultraviolet (UV) light or other energy source. Plastic includes thermoplastic materials and thermosetting materials. The term "flexible" refers generally to sheet materials that are thinner than about 1.5 mm.

Figure 1:
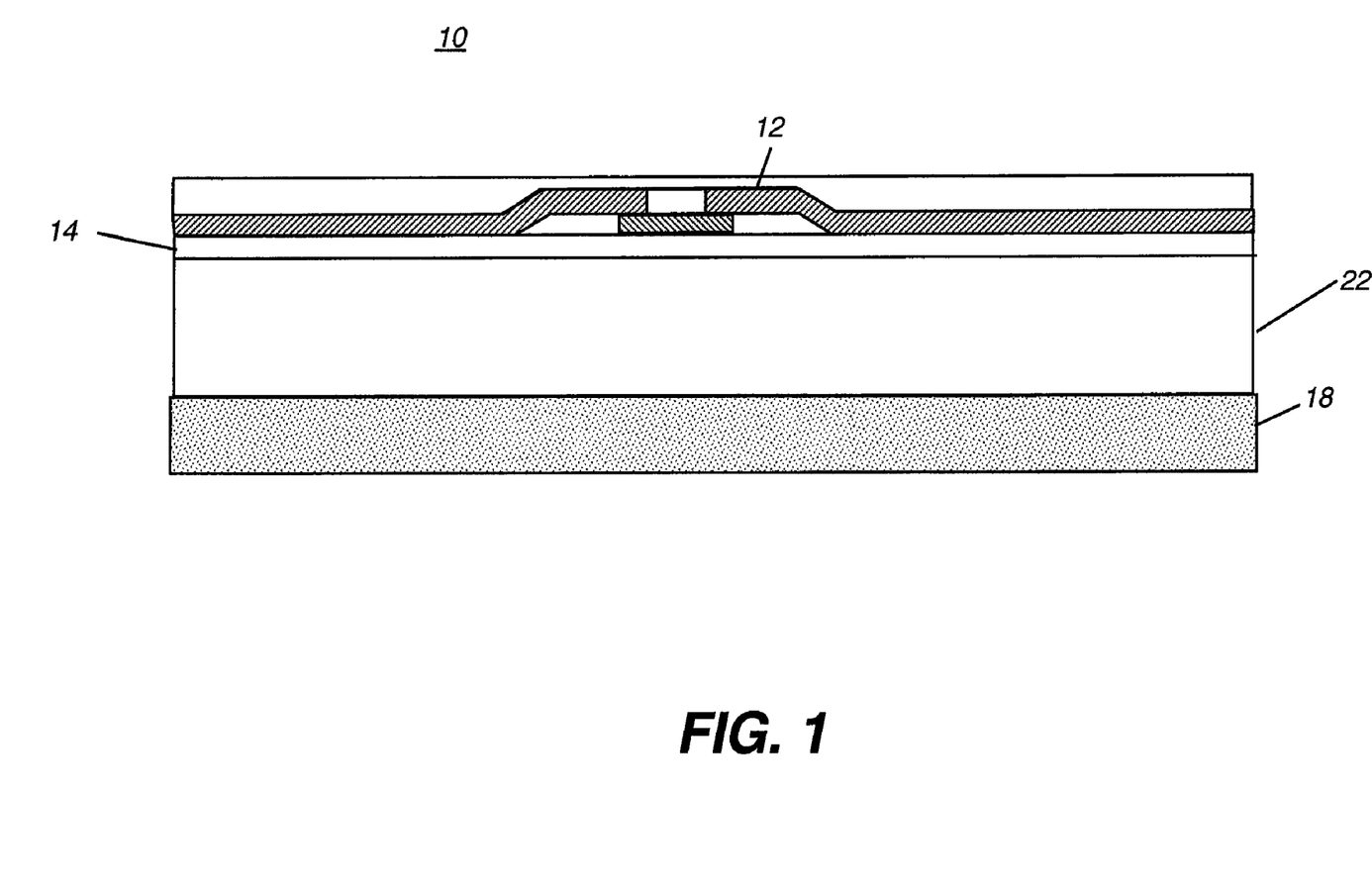
FIG. 1 is a side view of an electronic device formed on a flexible substrate supported on a carrier.

Referring to FIG. 1, there is shown an electronic device 10 formed on a carrier 18 using an approach described in U.S. patent application Ser. No. 11/461,080, previously mentioned. A thin-film component 12, such as a conductor, a thin-film transistor, a diode, or other component, is formed onto a flexible substrate 22 such as a metal foil. During device fabrication, substrate 22 is supported on a carrier 18 that provides dimensional stability for substrate 22 over the range of processing temperatures and conditions required for thin-film device manufacture.

A planarization or isolation layer 14 is typically applied to the substrate before components can be formed. This layer helps to smooth the surface and provide the needed surface quality that is required for thin-film circuitry fabrication. The thickness of planarization layer 14 depends on the roughness of the surface over which this layer is formed. Wherever a planarization treatment is needed, it is advantageous to make any planarization layer as thin as possible. For TFT and similar devices, this surface must have minimal surface roughness, no more than about 0.2-0.3 microns (peak-to-peak) and preferably no more than about 50 nm.

Unlike conventional methods, such as those noted earlier in the background section, embodiments of the present invention form substrate 22 by depositing substrate material in a casting process, that is, forming a "molded" substrate. Once the substrate sheet is formed, it can be removed from the cast and the inner surface that was formed against the cast (rather than the surface that faces outward when the substrate material is deposited) can be used as the base substrate surface for forming devices thereon.

Figure 2A:
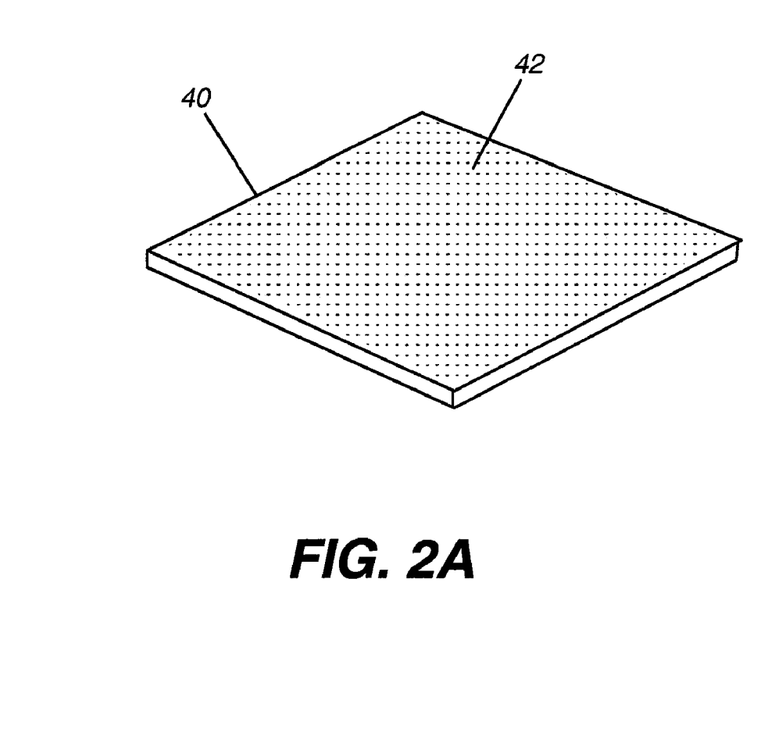
FIG. 2A is a perspective view of a master used for casting of a substrate.

FIG. 2A shows a master 40 that is used as a mold for casting an area of a substrate sheet 20. For forming TFT devices, master 40 has an extremely smooth surface, indicated by stippling in the Figure. In one embodiment, master 40 is a glass sheet, treated to provide a surface that is smooth to within less than about 50 nm, peak to peak. Because it can be formed into an exceptionally smooth surface, glass is particularly advantaged for use as master 40.

Because of the thinness of the substrate that is formed, the mold process differs from conventional molding for forming plastic items. Master 40 need not provide a "cavity" in the manner of a conventional mold. Instead, master 40 provides a casting surface 42 that is replicated onto the circuit-side surface of the cast, flexible substrate sheet 20 that is produced in accordance with the invention.

Figure 2B:
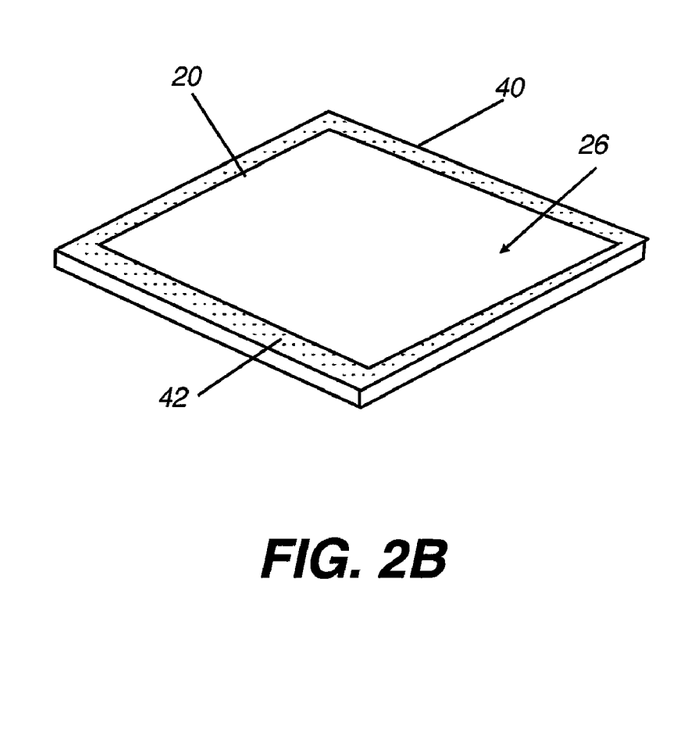
FIG. 2B shows deposition of substrate material onto the casting master.

FIG. 2B shows schematically the deposition of material for flexible substrate sheet 20 onto master 40. Any of a number of deposition methods can be used. Available deposition methods for applying thin coatings of flexible material onto a surface are well known to those in the coating art and can include precision methods such as inkjet application or spin coating, for example. However, unlike many conventional coating techniques that concern themselves with providing superior surface smoothness, the method of the present invention allows this requirement to be relaxed somewhat in many embodiments. That is, with respect to substrate sheet 20 in FIG. 2B, the visible, exposed side of substrate sheet 20, that is, the side facing upwards away from casting surface 42 as sheet 20 is being cast, forms the back side or surface 26 of the flexible substrate for circuit component fabrication. Since the substrate fabrication is by casting, the circuit-side surface 28 of the substrate, that is, the surface that lies against casting surface 42 of master 40, replicates the surface of the master and can thus be as smooth as the master. See FIG. 2C. Back surface 26 can often be relatively rough, having roughness in excess of 4 microns, for example, since in some embodiments no thin-film components are to be formed on this side.

The method of the present invention enables substrate sheet 20 to be formed having a range of possible thicknesses. It is possible to obtain substrate sheet 20 having thickness of 100 microns or less. Substrates for many applications, can be formed with thicknesses between 50 and 100 microns, or even between 10 and 50 microns using the method of the present invention.

Figure 2C:
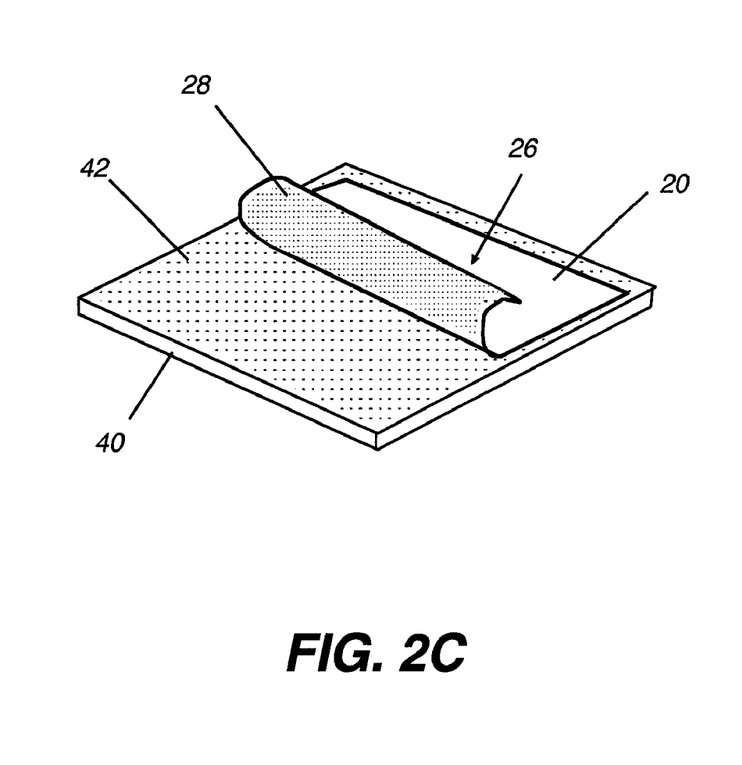
FIG. 2C shows removal of a cast substrate from the master.

Once the cast material has set, substrate sheet 20 can be removed from casting surface 42. FIG. 2C shows substrate sheet 20 being peeled back from casting surface 42 of master 40. Advantageously, circuit-side surface 28 of substrate sheet 20 replicates casting surface 42 of master 40. This surface replication gives substrate sheet 20 a highly smooth circuit-side surface 28. Subsequent description gives more detailed information on options for featuring surface 28 of substrate sheet 20 using master 40.

Figure 2D:
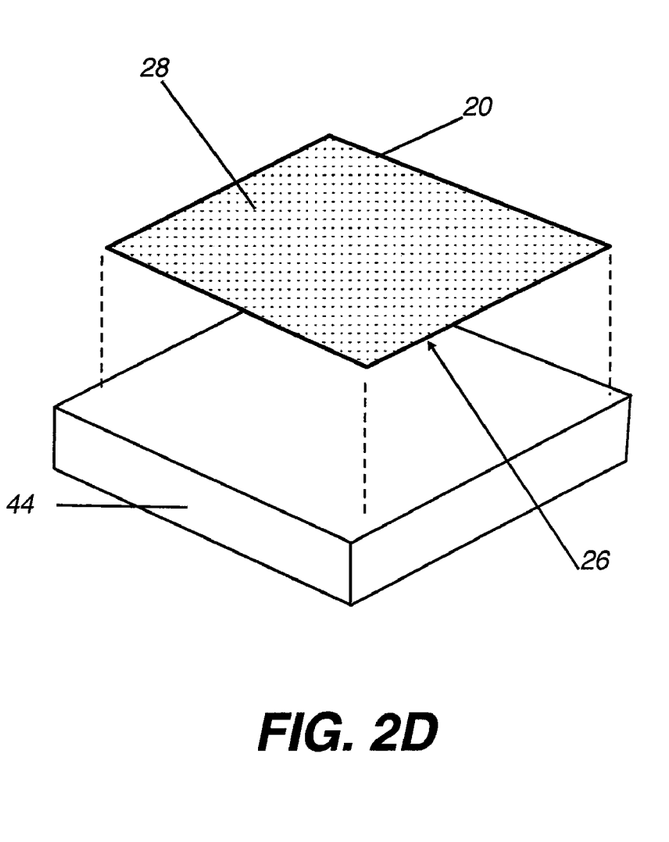
FIG. 2D is an exploded view showing positioning of a cast substrate on a carrier prior to electronic device fabrication.
Figure 2E:
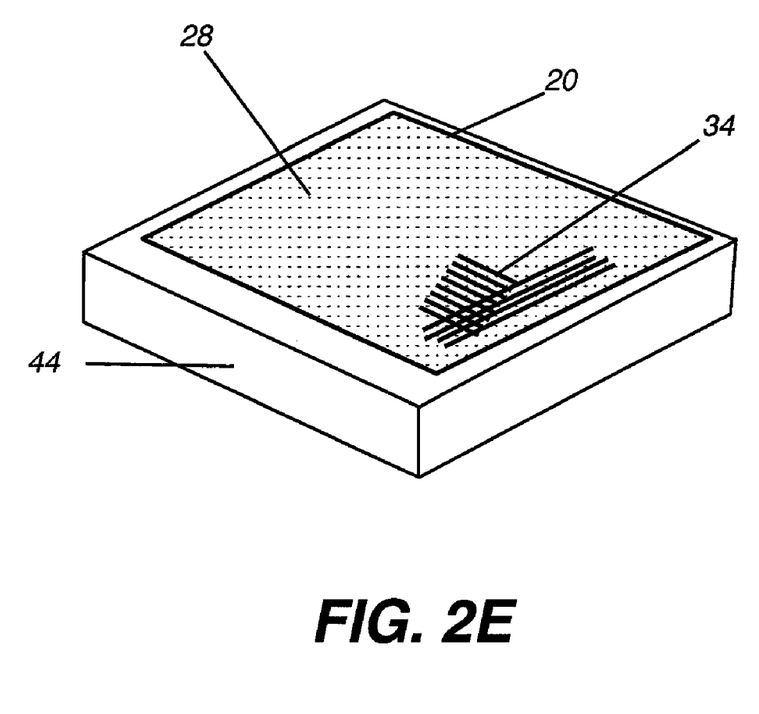
FIG. 2E shows a fabrication process forming a pattern on the circuit-side surface of the cast substrate.

As shown in the exploded view of FIG. 2D and assembled view of FIG. 2E, the newly formed flexible substrate sheet 20 can then be affixed, mounted, or otherwise secured to a carrier 44 for component fabrication. Carrier 44 may be made from glass. The replicated circuit-side surface 28 of substrate sheet 20 faces outward, enabling deposition, etching, and other processes for forming a pattern 34 on this cast surface, often without planarization. Pattern 34 may be an initial layer of the structure of an electronic device 10, such as would be formed on surface 28. Substrate sheet 20 can be secured against carrier 44 by lamination, adhesion, or other suitable method.

Material for substrate sheet 20 can be selected from a range of metal and plastic substances, based on desired properties. Some suitable plastic materials of special interest include polyimide, as noted earlier, and polytetrafluoroethylene (PTFE) or poly(perfluoro-alboxy)fluoropolymer (PFA), known commercially as Teflon®, sold by DuPont, Inc. A metal substrate sheet 20 has been made by sputtering a very thin layer of chromium to act as an adhesion layer, followed by plating of nickel to a thickness of about 100 microns to form the substrate. When the metal substrate is removed from casting surface 42, it is turned over to provide a circuit-side surface for device formation. Substrates also have been made by plasma deposition. Vacuum deposition and molten flow of metal, such as solder coated on glass, also may be used.

Just as there are a number of techniques available for the deposition process that forms substrate sheet 20, there are also a number of ways to release substrate sheet 20 from master 40 when casting is completed. These include the use of heat or cooling that creates an expansion difference between substrate sheet 20 and master 40 and takes advantage of their different Coefficients of Thermal Expansion (CTE). Either master 40, or substrate sheet 20, or both, can be subjected to heating or cooling. Other release methods can include use of solvents, irradiation at suitable wavelengths, vibration, and peeling, for example.

Example 1

In one embodiment, the material used for flexible substrate sheet 20 is polyimide. The deposition thickness for this material can be as low as about 10 microns. For this embodiment, a smooth circuit-side surface is required.

Given this material, TFT fabrication processing using a flexible substrate sheet 20 is as follows:

1. Preparation of master 40. A glass master is used for substrate casting, providing a highly smooth casting surface 42.
2. Deposition onto master 40. Spin coating, under controlled temperatures, is used to apply a thin polyimide coating onto master 40.
3. Curing. A curing period is provided for forming substrate sheet 20. Ultraviolet (UV) radiation curing is used in one embodiment.
4. Release. Master 40 is allowed to cool, in order to facilitate removal. Formed substrate sheet 20 is then peeled from master 40.
5. Securing substrate sheet 20 onto carrier 44. As was described with reference to FIG. 2D, substrate sheet 20 is then held on the surface of carrier 44 for processing, circuit-side surface 28 facing outward.

6. Component fabrication. One or more circuit elements is then patterned onto flexible substrate sheet 20, as shown by a pattern 34 in FIG. 2E. Substrate sheet 20 can then be removed from its carrier.

Figure 3A:
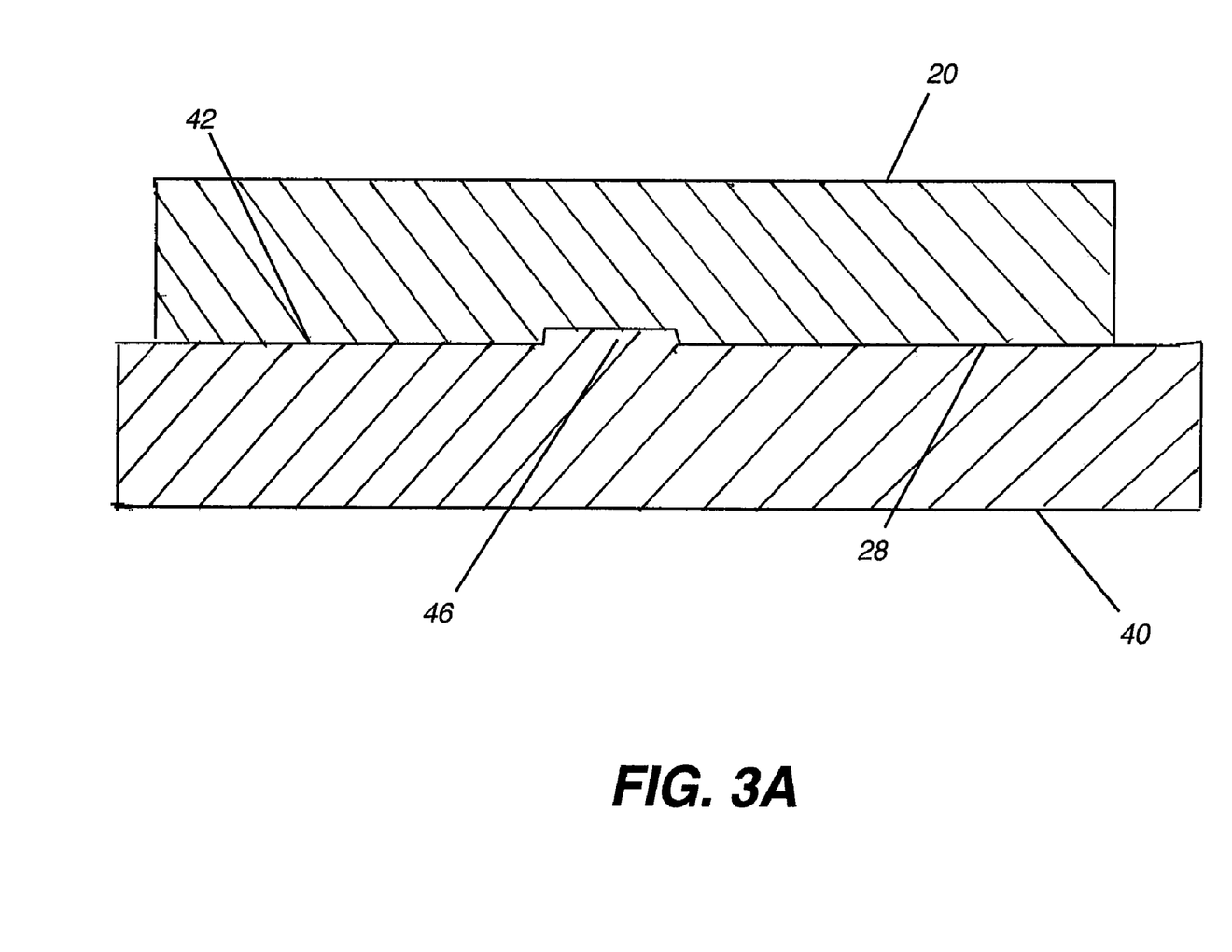
FIG. 3A shows a cross-sectional side view of a substrate cast on a featured master.
Figure 3B:
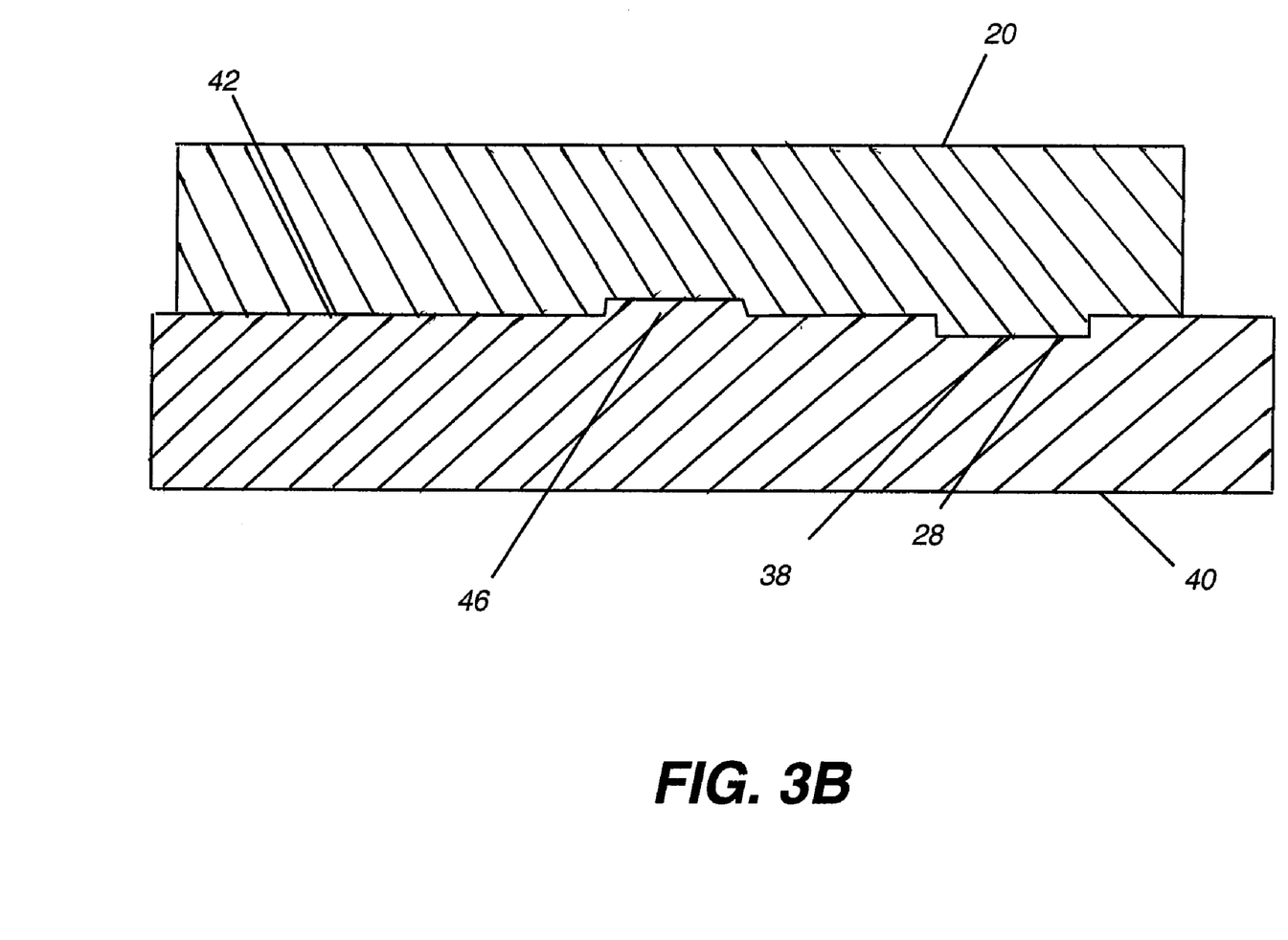
FIG. 3B shows a cross-sectional side view of a substrate cast on a more complex featured master.

Additional processing can be used to provide supplemental components and features using embodiments of the present invention. One notable advantage of the method of the present invention relates to the capability to add features to circuit-side surface 28. Referring to the cross-section of FIG. 3A, there is shown an embodiment in which master 40 has one or more features 46 formed on its casting surface 42. In the example of FIG. 3A, feature 46 protrudes from casting surface 42, so that replication forms an indent in circuit-side surface 28 of substrate sheet 20. FIG. 3B shows a second feature 38 indented into casting surface 42, so that replication forms a protrusion on circuit-side surface 28 of substrate sheet 20. Indentations and protrusions can be formed on casting surface 42 in any number of ways. Machining or etching processes, for example, could be used to remove material for forming indented features 38 (FIG. 3B). Deposition processes could be used for forming protruding features 46.

There are many potential uses for indentations or protrusions formed in cast substrate sheet 20. These include supporting subsequent fabrication steps in which various materials are deposited and patterned. In one embodiment, for example, channels formed in substrate sheet 20 are used for depositing a resist, such as SU-8 series photoresists available from MicroChem Corporation, Newton, Mass. Registration or cut-marks can also be formed using indentations or protrusions.

Figure 4:
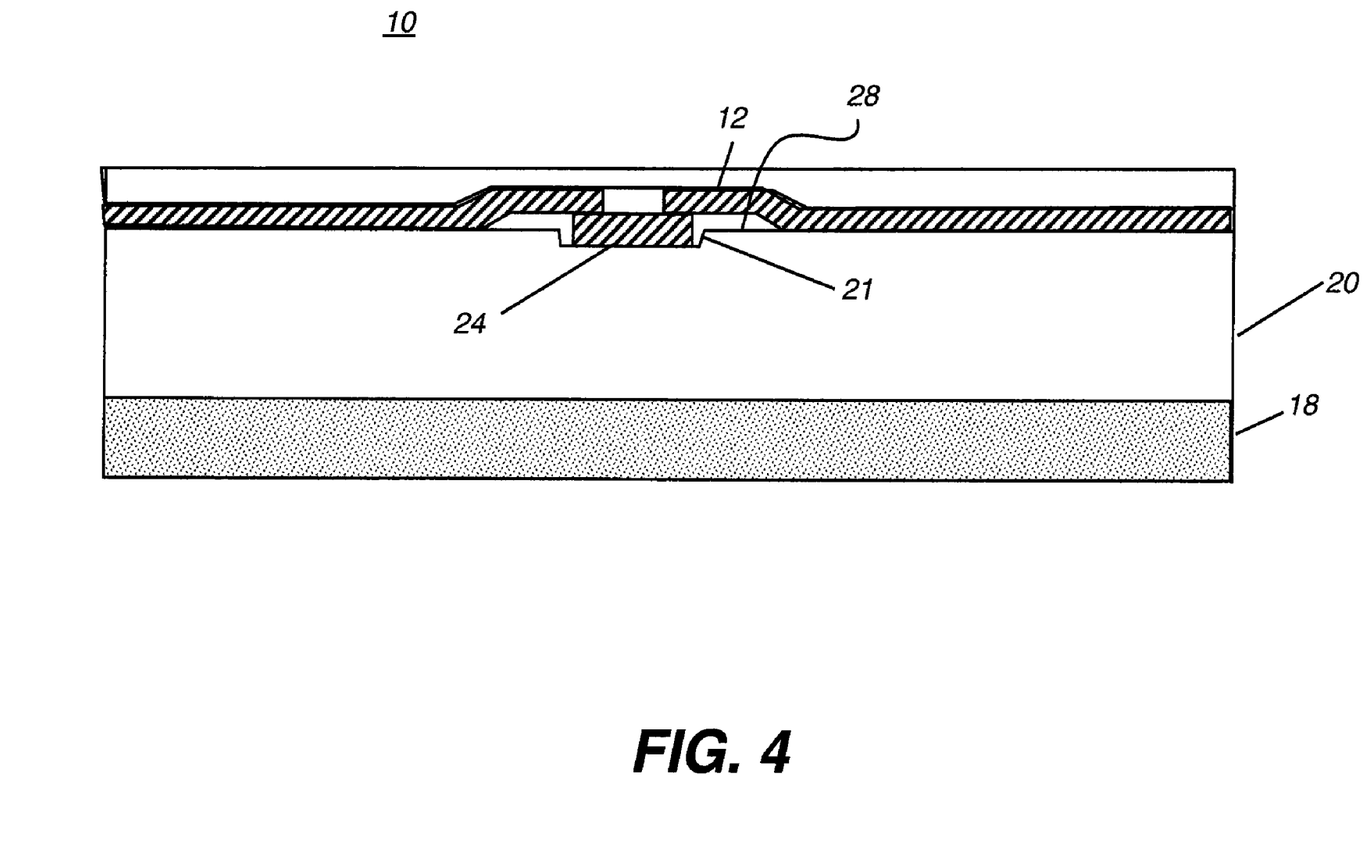
FIG. 4 shows a TFT formed on the circuit-side surface of a cast substrate fabricated according to one embodiment of the present invention.

Enabling substrate sheet 20 to be featured by casting in this way expands upon the capabilities for fabrication of circuit components on circuit-side surface 28. Forming indentations on circuit-side surface 28 allows subsequent deposition and patterning steps to apply materials of various thicknesses. The end view of FIG. 4 shows thin film component 12 fabricated on substrate sheet 20 formed with an indentation 21 for a gate electrode 24. With indentation 21, gate electrode 24 can have increased thickness. This alters the arrangement over the conventional fabrication arrangement that was shown earlier in FIG. 1. Notably, planarization layer 14 in the arrangement of FIG. 1, may not be needed with embodiments of the present invention, since casting surface 42 can be used to form an extremely smooth circuit-side surface 28 on substrate sheet 20.

Figure 5A:
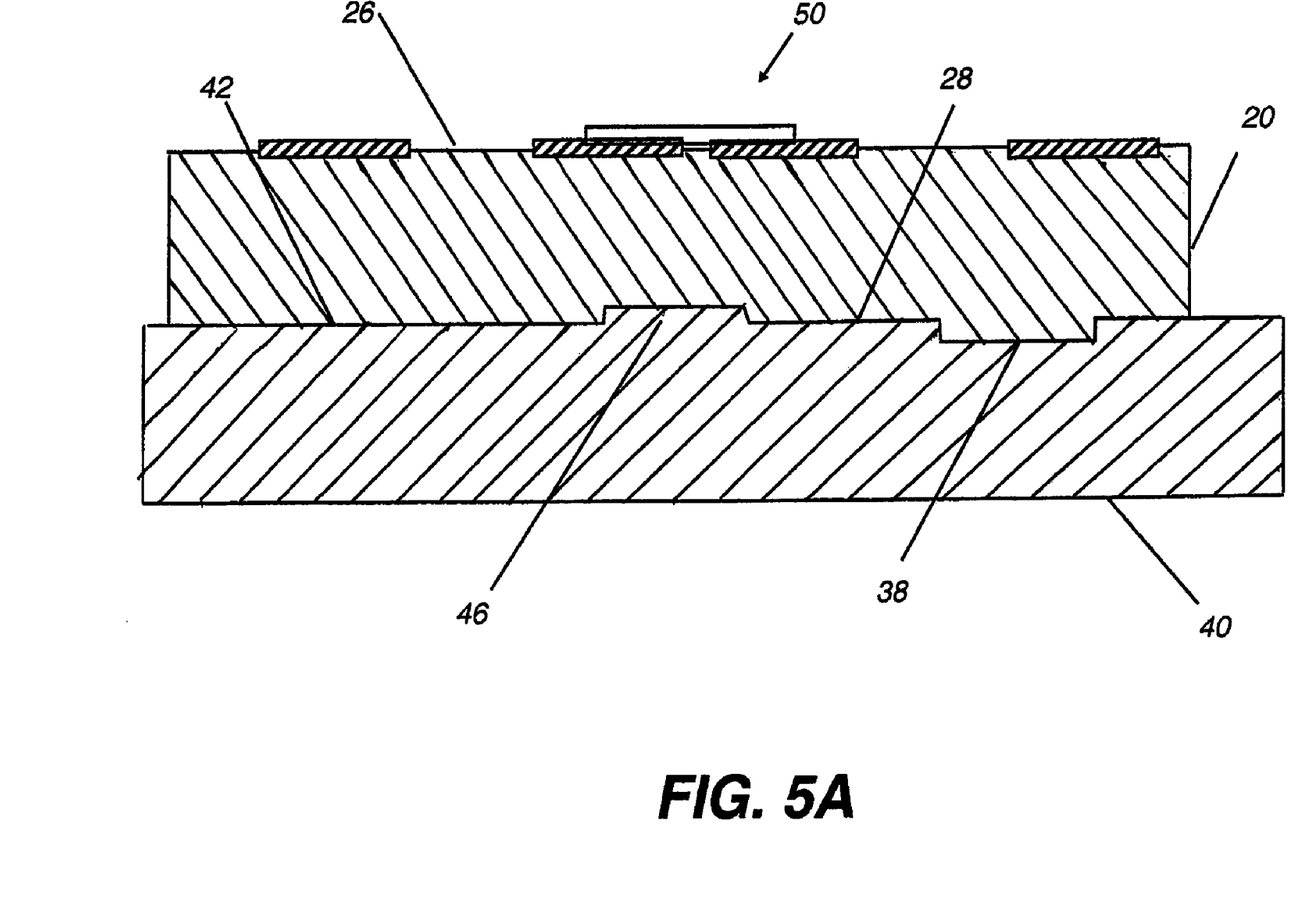
FIG. 5A shows a cross-sectional side view of a substrate cast on a featured master with the addition of deposited patterns on an exposed back surface of the substrate.

Still other advantages of the method of the present invention relate to forming traces or other patterns or patterned components on back surface 26 of substrate sheet 20. These could include various electronic devices, where patterns are formed from one or more of metals, semiconductor, and dielectric materials. Referring to the cross-sectional view of FIG. 5A, a pattern 50 of material is formed on back surface 26 while substrate sheet 20 is still on master 40. Pattern 50 could include one or more layers, such as planarization layers or backing layers with one, two, or more layers of conductive traces, for example, along with patterned semiconductor materials, and could include via interconnections between layers. In one embodiment, pattern 50 includes circuit traces for signal, power, or ground lines fabricated onto back surface 26 prior to release of substrate sheet 20 from master 40 and intended to support circuit components that will be fabricated on circuit-side surface 28. Pattern 50 could be provided to help alleviate stresses in the material that can result from component fabrication steps. Pattern 50 for application on back surface 26 can be specifically designed so that its particular arrangement complements the pattern of circuit components formed on circuit-side surface 28.

Figure 5B:
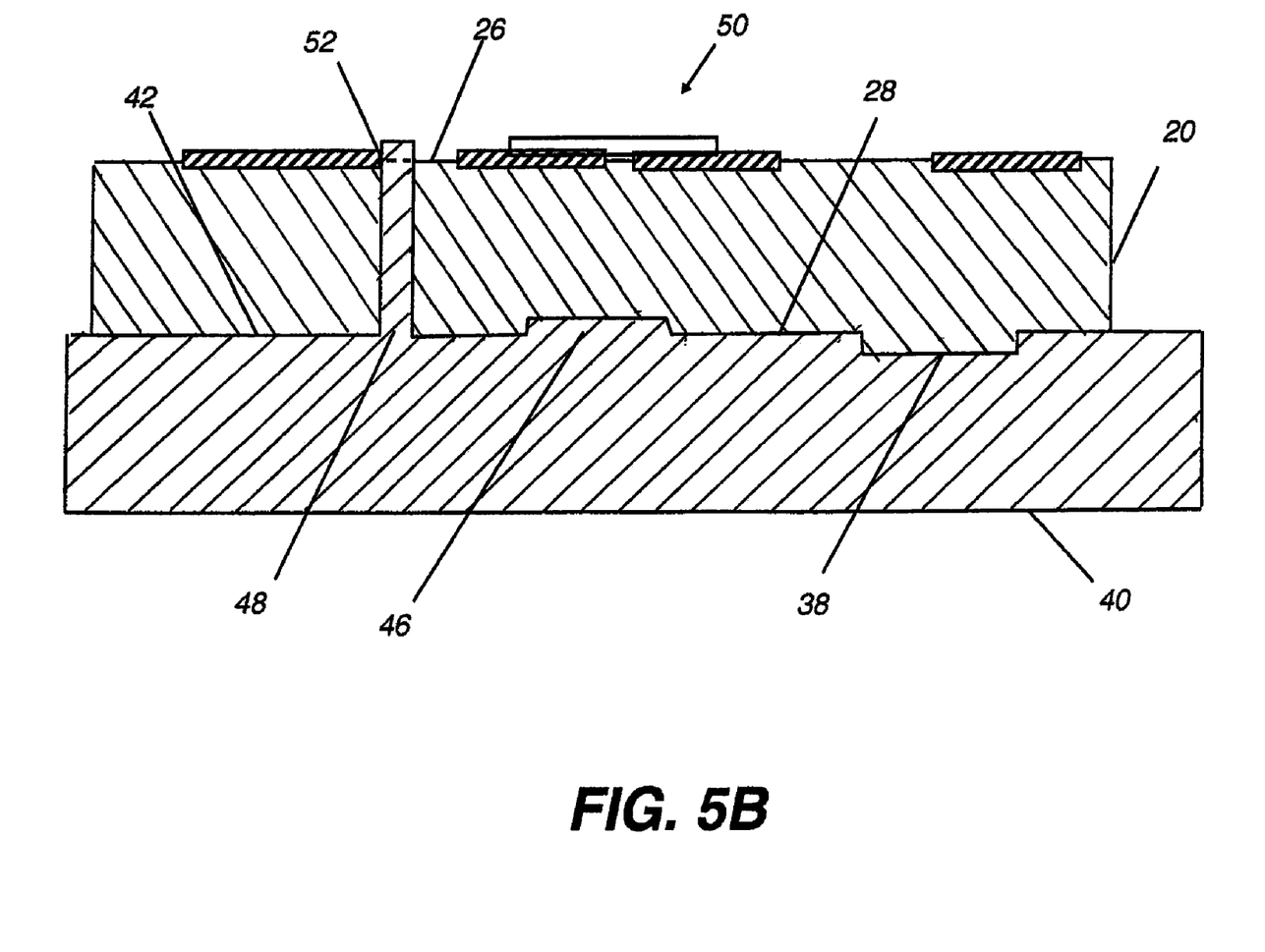
FIG. 5B shows a cross-sectional side view of a substrate cast on a featured master with a surface feature for forming a via perforation.

FIG. 5B shows an alternate embodiment in which a protrusion 48 from casting surface 42 forms a via perforation 52. Protrusion 48 could be a pin or other suitable structure for forming via perforation 52 during substrate deposition, rather than by using subsequent drilling or etching processes. Perforations could also be used for more accurately registering cast substrate sheet 20 onto carrier 44 (FIG. 2D).

Example 2

The following example forms a more complex arrangement than that given in the first example, with patterned structures additionally provided on back surface 26. Polyimide is used for flexible substrate sheet 20.

Given this material, TFT fabrication processing with a flexible substrate sheet 20 is as follows:

1. Preparation of master 40. A glass master is used for substrate casting. Master 40 includes a number of features 46 and 38 (FIG. 5B) for forming corresponding indentations and protrusions on circuit side surface 28 upon casting.
2. Deposition of substrate material onto master 40. An inkjet application process is used to apply a thin polyimide material onto master 40. With inkjet printing methods, the application of additional material into surface indentations is facilitated.
3. Curing. The substrate material is cured to form substrate sheet 20.
4. Support rib deposition. A thin mesh of support ribbing is formed at appropriate locations on back surface 26 of substrate sheet 20. For example, see FIG. 5A.
5. Circuit trace formation. Circuit traces are formed on back surface 26. Conventional photoetching or other methods could be used for forming conductive circuit traces.
6. Release. Master 40 is allowed to cool, in order to facilitate removal. Formed substrate sheet 20 is then peeled from master 40.
7. Securing substrate sheet 20 onto carrier 18. As was described with reference to FIG. 2D, substrate sheet 20 is then held on the surface of carrier 18 for processing, circuit-side surface 28 facing outward.
8. Component fabrication. One or more circuit elements is then patterned onto flexible substrate sheet 20, as was shown by pattern 34 in FIG. 2E. Substrate sheet 20 can then be removed from carrier 18.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention.

The electronic device formed on substrate sheet 20 can be used to provide signals to or from any of a number of different types of components and would have particular applications for image display pixels or image sensing pixels. For example, the electronic device formed on the substrate sheet 20 surface can be coupled with a corresponding liquid crystal pixel, light-emitting diode pixel, or organic light-emitting diode pixel for display, for example. For image sensing, the electronic device formed on the substrate sheet 20 surface can be coupled with a stimulable phosphor pixel or with another type of sensor pixel, including a biological detector. Thus, what is provided is a method for fabrication of an electronic device on a cast, flexible substrate.

PARTS LIST

10. Electronic device
12. Thin-film component
14. Planarization or isolation layer
18. Carrier
20. Flexible substrate sheet
21. Indentation
22. Flexible substrate
24. Gate electrode
26. Back surface
28. Circuit-side surface
34. Pattern
38. Feature
40. Master
42. Casting surface
44. Carrier
46. Feature
48. Protrusion
50. Pattern
52. Via perforation

The invention claimed is:

1. A method for forming an electronic device comprising:
    forming a master having a casting surface;
    depositing a substrate material onto the casting surface to form a flexible substrate sheet of predetermined thickness, wherein the flexible substrate sheet has a circuit-side surface that is formed against the casting surface, and a back surface;
    releasing the flexible substrate sheet from the master;
    securing the flexible substrate sheet against a carrier, with the circuit-side surface facing outward; and
    forming the electronic device on the circuit-side surface of the flexible substrate sheet while the back surface of the flexible substrate sheet is secured against the carrier.

2. The method of claim 1 wherein the carrier is formed from glass.

3. The method of claim 1 wherein the casting surface of the master is featured with at least one indentation or protrusion.

4. The method of claim 1 wherein the substrate material is polyimide.

5. The method of claim 1 wherein the substrate material is plastic.

6. The method of claim 1 wherein the substrate material is metal.

7. The method of claim 1 wherein releasing the flexible substrate comprises cooling the master, the substrate, or both.

8. The method of claim 1 further comprising forming one or more patterns of material on the back surface prior to releasing the sheet from the master.

9. The method of claim 8 wherein the one or more patterns of material are taken from the group consisting of metals, semiconductors, and dielectrics.

10. The method of claim 8 further comprising forming one or more vias between the patterns of material formed on the back surface and the circuit-side surface.

11. The method of claim 1 wherein releasing the flexible substrate sheet comprises using a solvent.

12. The method of claim 1 wherein releasing the flexible substrate sheet comprises applying radiant energy to the substrate sheet or to the master.

13. The method of claim 1 further comprising curing the substrate material that is deposited onto the casting surface.

14. The method of claim 13 wherein curing comprises irradiating the substrate material with ultraviolet radiation.

15. The method of claim 1 wherein the predetermined thickness is less than 100 microns.

16. The method of claim 1 wherein the predetermined thickness is between about 50 and 100 microns.

17. The method of claim 1 wherein the predetermined thickness is between about 10 and 50 microns.

18. The method of claim 1 wherein depositing the substrate material comprises spin-coating.

19. The method of claim 1 wherein depositing the substrate material comprises printing the material onto the casting surface.

* * * * *